United States Patent
Noguchi et al.

(10) Patent No.: US 6,858,456 B2
(45) Date of Patent: Feb. 22, 2005

(54) METHOD FOR MANUFACTURING A LIGHT EMITTING DEVICE

(75) Inventors: Katsuhiko Noguchi, Yamanashi-ken (JP); Megumi Horiuchi, Yamanashi-ken (JP)

(73) Assignee: Citizen Electronics Co., Ltd., Yamanashi-Ken (JP)

( * ) Notice: Subject to any disclaimer, the term of this patent is extended or adjusted under 35 U.S.C. 154(b) by 0 days.

(21) Appl. No.: 10/668,204

(22) Filed: Sep. 24, 2003

(65) Prior Publication Data

US 2004/0090161 A1 May 13, 2004

(30) Foreign Application Priority Data

Sep. 26, 2002 (JP) ........................................ 2002-282023

(51) Int. Cl.⁷ .............................................. H01L 21/00
(52) U.S. Cl. .............................. 438/26; 438/28; 438/29; 438/34
(58) Field of Search ............................ 438/26, 28, 29, 438/34

(56) References Cited

U.S. PATENT DOCUMENTS 6,069,440 A * 5/2000 Shimizu et al. ............. 313/486
6,319,425 B1 * 11/2001 Tasaki et al. ............ 252/301.36
6,333,522 B1 * 12/2001 Inoue et al. .................. 257/99
6,351,069 B1 * 2/2002 Lowery et al. .............. 313/512

FOREIGN PATENT DOCUMENTS

JP 09330611 A * 12/1997
JP 2001222242 A * 8/2001

* cited by examiner

*Primary Examiner*—Trung Dang
(74) *Attorney, Agent, or Firm*—Dennison, Schultz, Dougherty & MacDonald (57) ABSTRACT

Light emitting elements are mounted on substrates to produce a plurality of light emitting element units and a plurality of cover members are manufactured. Each of the cover members includes phosphor particles and pigment particles. Wavelength and luminance of light emitted from the light emitting element of each of the light emitting element units is measured. The measured wavelengths and luminances of lights emitted from the light emitting elements are classified into ranks. The wavelengths of lights emitted from the phosphor particles are classified into ranks and the mixing ratios of pigments are classified. Ranks of the light emitting elements and ranks of the cover members are classified into groups in accordance with desired characteristic. A light emitting element and a cover member belonging to same group are mounted in a case.

15 Claims, 9 Drawing Sheets

COMBINATION OF LED AND COVER MEMBER

| GROUP | BLUE LED RANK | COVER MEMBER RANK |
|-------|---------------|-------------------|
| G 1   | a 1 b 1       | c 1 d 1           |
| G 2   | a 2 b 1       | c 2 d 1           |
| G 3   | a 3 b 1       | c 3 d 1           |
| G 4   | a 4 b 1       | c 4 d 1           |
| G 9   | a 1 b 3       | c 1 d 3           |
| G 10  | a 2 b 3       | c 2 d 3           |
| G 11  | a 3 b 3       | c 3 d 3           |
| G 12  | a 4 b 3       | c 4 d 3           |
| G 13  | a 1 b 4       | c 1 d 4           |
| G 14  | a 2 b 4       | c 2 d 4           |
| G 15  | a 3 b 4       | c 3 d 4           |
| G 16  | a 4 b 4       | c 4 d 4           |

RANKING OF WAVELENGTH

| RANKING NUMBER | WAVELENGTH RANGE |
|---|---|
| a 1 | 4 6 2 ~ 4 6 6 n m |
| a 2 | 4 6 6 ~ 4 7 0 n m |
| a 3 | 4 7 0 ~ 4 7 4 n m |
| a 4 | 4 7 4 ~ 4 7 8 n m |

FIG. 6

RANKING OF LUMINANCE

| RANKING NUMBER | LUMINANCE RANGE |
|---|---|
| b 1 | 0.6 ~ 0.8 |
| b 2 | 0.8 ~ 1.1 |
| b 3 | 1.1 ~ 1.5 |
| b 4 | 1.5 ~ 2.0 |

FIG. 7

RANKING OF WAVELENGTH OF COVER MEMBER

| RANKING NUMBER | WAVELENGTH RANGE |
|---|---|
| c 1 | 5 6 0 ~ 5 6 5 n m |
| c 2 | 5 6 5 ~ 5 7 0 n m |
| c 3 | 5 7 0 ~ 5 7 5 n m |
| c 4 | 5 7 5 ~ 5 8 0 n m |

FIG. 8

RANKING OF MIXING RATIO

| RANKING NUMBER | MIXING RATIO OF PIGMENT |
|---|---|
| d 1 | 0 % |
| d 2 | 1 5 % |
| d 3 | 3 0 % |
| d 4 | 4 5 % |

FIG. 9

COMBINATION OF LED AND COVER MEMBER

| GROUP | BLUE LED RANK | COVER MEMBER RANK |
|---|---|---|
| G 1 | a 1 b 1 | c 1 d 1 |
| G 2 | a 2 b 1 | c 2 d 1 |
| G 3 | a 3 b 1 | c 3 d 1 |
| G 4 | a 4 b 1 | c 4 d 1 |
| G 9 | a 1 b 3 | c 1 d 3 |
| G 10 | a 2 b 3 | c 2 d 3 |
| G 11 | a 3 b 3 | c 3 d 3 |
| G 12 | a 4 b 3 | c 4 d 3 |
| G 13 | a 1 b 4 | c 1 d 4 |
| G 14 | a 2 b 4 | c 2 d 4 |
| G 15 | a 3 b 4 | c 3 d 4 |
| G 16 | a 4 b 4 | c 4 d 4 |

FIG. 19
PRIOR ART

METHOD FOR MANUFACTURING A LIGHT EMITTING DEVICE

BACKGROUND OF THE INVENTION

The present invention relates to a method for manufacturing a light emitting device.

Figure 17:
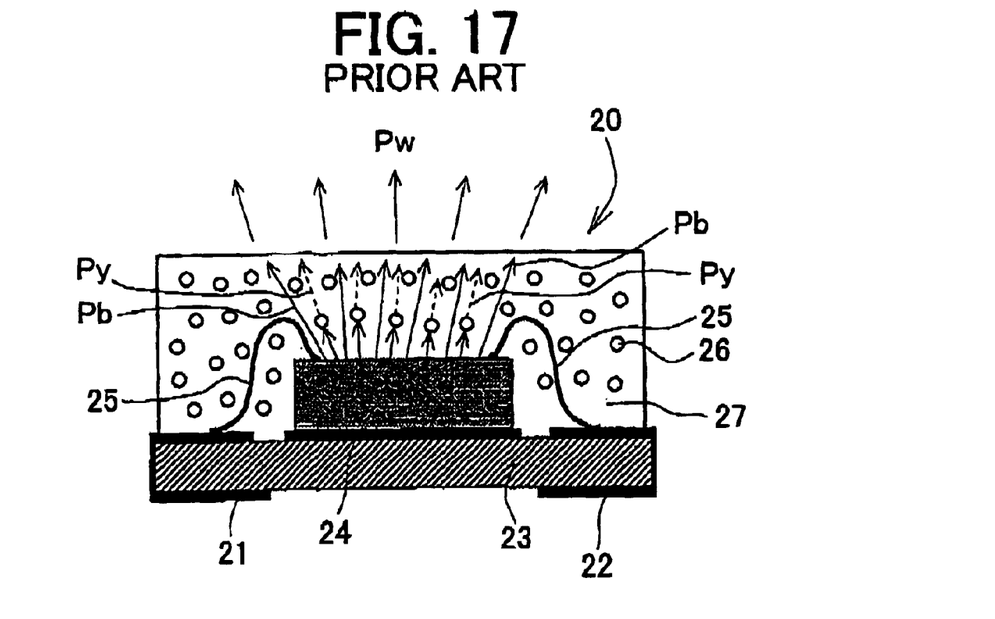
FIG. 17 is a sectional view of a conventional LED device.

FIG. 17 is a sectional view of a conventional LED device disclosed in U.S. Pat. No. 6,069,440. The white LED device 20 comprises a substrate 23, electrodes 21 and 22 secured to the substrate 23 and a blue LED 24 mounted on the substrate 23. The LED 24 is connected to the electrodes 21 and 22 by lead wires 25. The LED 24 and electrodes 21, 22 are encapsulated with a transparent encapsulating resin 27.

In the resin 27, fluorescent materials of YAG group is mixed. The fluorescent material comprises phosphor particles 26.

When the current is applied to the blue LED 24 via electrodes 21 and 22, the LED emits blue light Pb. When a portion of the blue light impinges upon the phosphor particle, the phosphor particle absorbs the blue light and emits yellow light Py. When the yellow light Py and the blue light Pb are combined, white light Pw is created.

Furthermore, U.S. Pat. No. 6,319,425 discloses an LED covered by a cap in which fluorescent material is included.

Further, U.S. Pat. No. 6,351,069 discloses an LED encapsulated by a transparent resin in which two kinds of phosphor particles are included, thereby producing white light.

However, since the LED is a compound semiconductor, there is wide variation in chromaticity and luminance of products. Further, the chromaticity and luminance of the mixed white light Pw also vary widely because of difference of quantity and distribution of the phosphor particles in the encapsulating resin.

Figure 18:
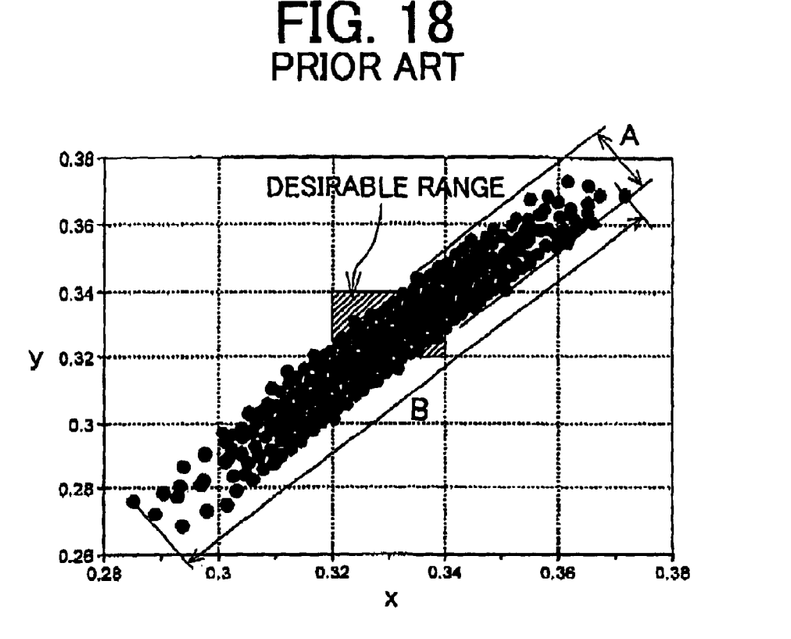
FIGS. 18 and 19 are graphs showing dispersion in chromaticity and luminance of LED devices.
Figure 19:
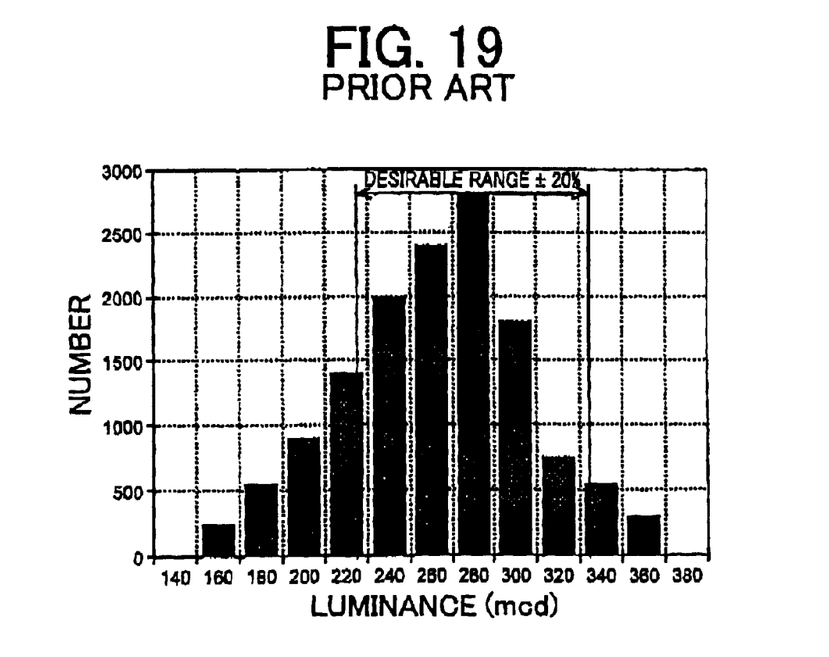

FIGS. 18 and 19 are graphs showing numeric data widely varied in chromaticity and luminance of LED devices.

FIG. 18 is a graph of XYZ coordinates showing variation in chromaticity of LED devices by 1 lot mass production. Each black point indicates the chromaticity of an LED device. The variation is in an upward zonal arrangement. Here, the dispersion of black points in the width direction shown by the letter A means the variation of chromaticity of the blue LED, the dispersion in the longitudinal direction shown by the letter B means the variation of quantity and distribution of the phosphor particles in the encapsulating resin.

An LED device having chromaticity which is largely deviated from a central value in FIG. 18 can not be used as a device for emitting white light. It is frequently desirable that the LED device has chromaticity in a central range shown by hatching where X and Y are in a range of 0.33±0.01.

In the graph of FIG. 19, the horizontal axis shows luminance and the vertical axis shows the number of LED devices. The luminance variation is distributed in +30% to −40% range from the center of the distribution. However, a desirable range is about ±20% as shown by arrows in FIG. 19.

SUMMARY OF THE INVENTION

An object of the present invention is to provide a method which may correct the chromaticity and luminance to desired values.

According to the present invention, there is provided a method for manufacturing a white light emitting device comprising the steps of classifying wavelengths and luminances of lights emitted from light emitting elements into ranks respectively, providing various kinds of combinations of a fluorescent material for converting the wavelength of the light emitted from the light emitting element and a luminance reducing material for adjusting the luminance of the light, in accordance with the rank classification of the wavelength and luminance of the light, manufacturing a plurality of cover members, in each of the cover members a fluorescent material and a luminance reducing material of one of combinations are mixed, selecting the light emitting element and the cover member, integrating the selected light emitting element and cover member.

Both the phosphor particles and luminance reducing material may be included in a same cover member.

The cover member may comprise a first cover member mixing the fluorescent material, and a second cover member mixing the luminance reducing member.

The cover member is formed with elastomer of silicon group in which the fluorescent material and the luminance reducing material are mixed.

The luminance reducing material is pigment or dye for reducing the luminance irrespective of the wavelength of the light emitting from the light emitting element.

The light emitting element is mounted on a substrate to be integrated with the substrate as a light emitting element unit.

The present invention further provides a method for manufacturing a white light emitting device comprising the steps of measuring chromaticities and luminances of lights emitted from a plurality of blue light emitting elements, classifying the measured chromaticities and luminances of lights emitted from the light emitting elements into ranks respectively, manufacturing a plurality of cover members, which are different from each other in accordance with the rank classification of the blue light emitting elements, combining the blue light emitting element and the cover member which are suitable to be combined according to the ranking and setting the combined blue light emitting element and cover element in a case body in an integrated state.

The present invention also provides a method for manufacturing a white light fitting device comprising the steps of measuring chromaticities and luminances of lights emitted from a plurality of blue light emitting elements, classifying the measured chromaticities and luminances of lights emitted from the light emitting elements into ranks respectively, manufacturing a case assembly having a plurality of case bodies, mounting a plurality of blue light emitting elements belonging to a same rank in case bodies, manufacturing a plurality of cover members including various fluorescent materials and luminance reducing materials, securing cover members having a same condition as the blue light emitting elements mounted on the case assembly to the case bodies to produce complete light emitting devices and separating the complete light emitting devices from the case assembly.

The cover members corresponding to the case bodies on the case assembly are connected with each other to form a cover member assembly, each of the cover members is located at a position corresponding to a case body on the case assembly.

The fluorescent materials and the luminance reducing materials in the cover members in the cover member assembly are nearly identical in mixing condition.

The case body has a recess having a reflection face, and the light emitting element is mounted on a bottom of the recess, and the cover member is mounted in the recess.

The light emitting element is an LED of InGaN group.

The fluorescent material is a fluorescent material of YAG group.

The luminance reducing material is a pigment of black.

The case body comprises a pair of metal cores, the surface of the metal cores are coated with bright plating.

These and other objects and features of the present invention will become more apparent from the following detailed description with reference to the accompanying drawings.

DETAILED DESCRIPTION OF THE PREFERRED EMBODIMENT

Figure 1:
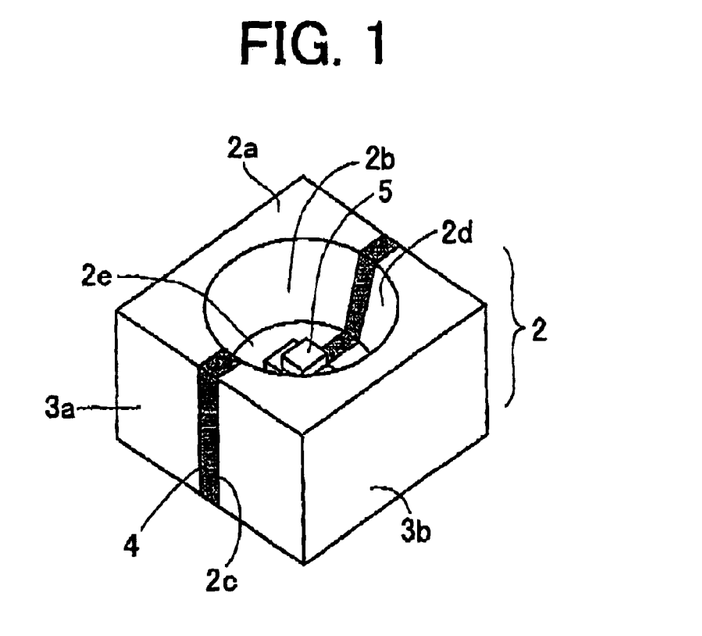
FIG. 1 is a perspective view of an LED device of the present invention before the cover member being mounted.
Figure 2:
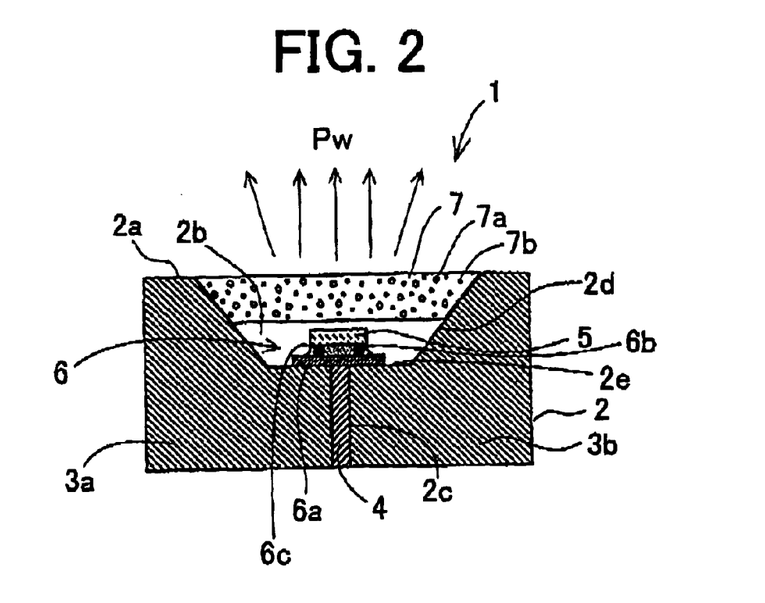
FIG. 2 is a sectional view of a finished LED device.

FIG. 1 is a perspective view of an LED device of the present invention before the cover member being mounted, and FIG. 2 is a sectional view of the LED device after the cover member being mounted.

Referring to FIG. 1, a white LED device 1 comprises a cubic case 2 made of metal having a high heat conductivity such as Mg group, Al group and Cu group, and having a recess 2b of an inverted truncated cone. The case 2 comprises a pair of first and second half metal cores 3a and 3b, interposing an insulation layer 4 made of resin and charged in a slit 2c. The inside wall of the recess 2b is processed into a light reflection surface by silver plating. A light emitting element unit 6 is mounted in the recess 2b. The light emitting element unit 6 comprises a substrate 6a secured to the metal cores 3a and 3b by a solder, a blue LED 5 as a light emitting element mounted on the substrate 6a, bumps 6b so as to apply the current to the light emitting element unit 6 thereby. The underside of the LED 5 is encapsulated by a resin 6c to protect the bumps 6b.

A cover member 7 of transparent resin has an outside shape so as to engage with the recess 2b. If required, the cover member 7 is secured to the recess 2b by caulking or an adhesive. In the cover member 7, YAG phosphor particles 7a, and pigment or dye particles 7b as a luminance reducing material are mixed. The phosphor particle 7a and the pigment particle 7b are selected so that the chromaticity of the light emitted from the LED 5 is corrected to desired chromaticity.

In operation, when the current is applied to the metal cores 3a and 3b, the current is applied to the blue LED 5 via the substrate 6a and bumps 6b. Thus the LED 5 is excited to emit blue light. When a part of the blue light impinges upon the phosphor particle 7a, the blue light is absorbed in the phosphor particle 7a and the particle emits yellow light. When the yellow light and the blue light which does not impinge upon the phosphor particle are mixed, white light Pw produces. Further, the chromaticity and luminance of the white light are corrected to desired chromaticity and luminance by the phosphor particle 7a and the pigment particles 7b.

Next, the method for selecting the cover member having the phosphor material and the pigment in the manufacturing steps of the LED device of the present invention is described hereinafter, At the step of measuring the wavelength and the luminance of the light emitted from the blue LED are measured by an LED tester, the blue LEDs are classified into groups.

Figure 3:
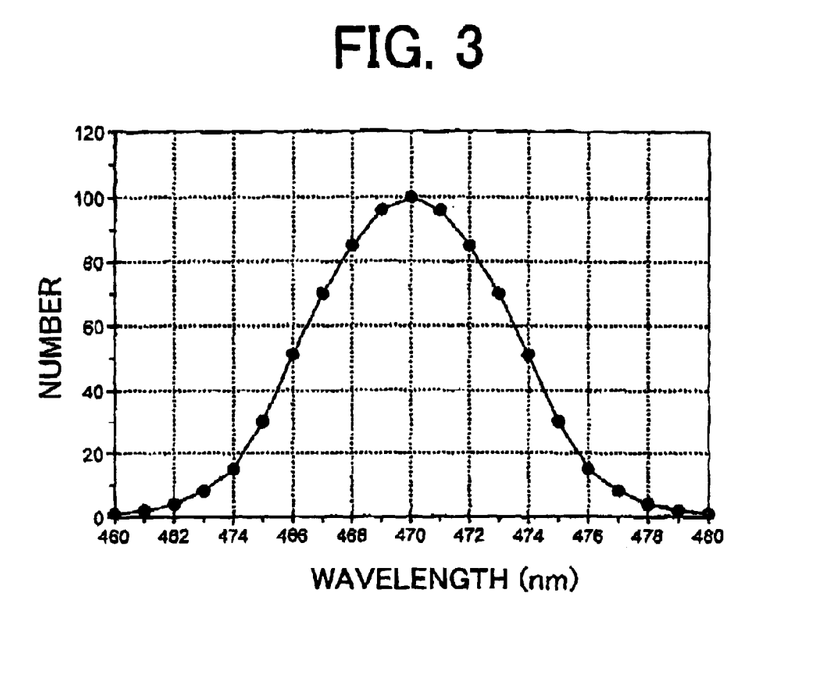
FIG. 3 is a graph showing distribution of measured wavelengths of the emitted lights.

FIG. 3 is a graph showing distribution of measured wavelengths of the emitted lights. The horizontal axis designates the wavelength and the vertical axis designates the number of LED devices. The wavelength is distributed between 460 and 480 nm about peak 470 nm.

Figure 4:
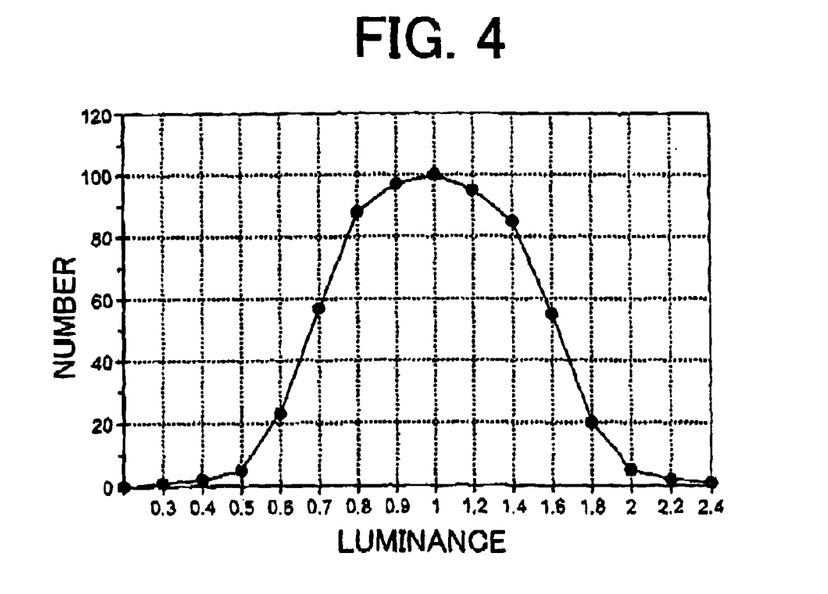
FIG. 4 is a graph showing distribution of measured luminance of the emitted lights.

FIG. 4 is a graph showing distribution of measured luminance of the emitted lights. The horizontal axis designates the luminance and the vertical axis designates the number of LED devices. The luminance is distributed between 0.2 and 2.4. The light emitting elements having less than 0.6 luminance are not used for the device because of their low luminance.

The distribution data of the wavelength and luminance are classified into four groups.

Figure 5:
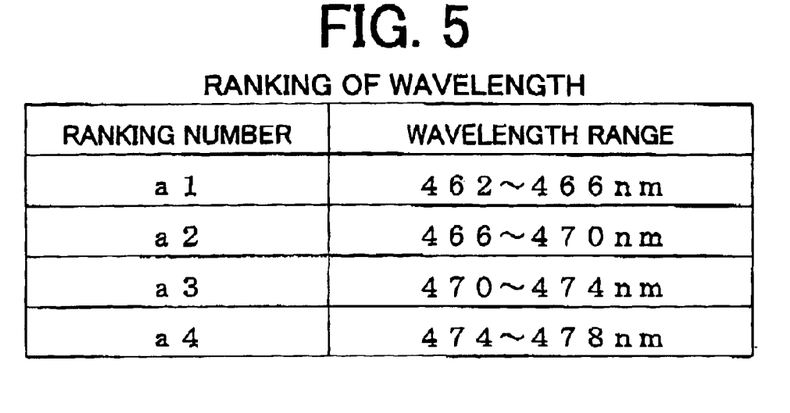
FIG. 5 is a ranking of wavelengths.

FIG. 5 shows ranking groups of wavelengths. The wavelength is classified into ranking numbers a1~a4 in the range between 462 and 478. The range of one group is 4 nm.

Figure 6:
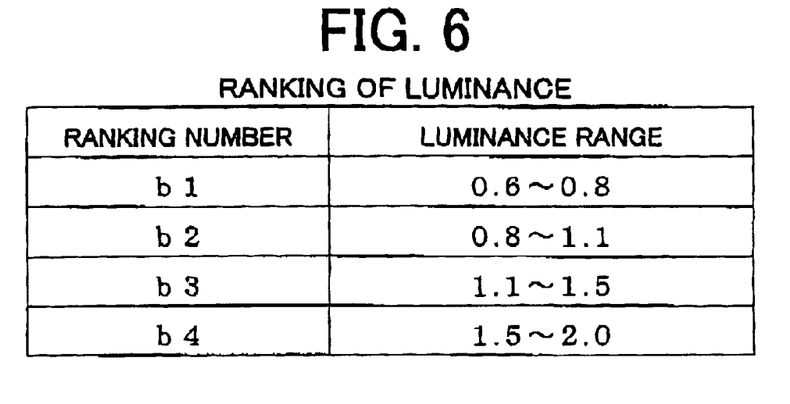
FIG. 6 is a ranking of luminance.

FIG. 6 shows ranking groups of luminance. The luminance classified into ranking numbers b1~b4 in the range between 0.6 and 2.0. The range of one group is 1.35.

Thus, the blue LED is classified into 16 groups (4 groups×4 groups=16 groups). Namely, 16 ranking groups are indicated as a1b1, a1b2, . . . a4b4.

Next, the wavelength of yellow light produced by the impinging of blue light upon the phosphor particles 7a is classified into four ranks. The wavelength of the yellow light can be changed by changing the ratio between components of the phosphor material of the YAG group such as gallium and gadolinium. Sere, phosphor materials having a peak wavelength 570 nm are classified into four ranks in a range between 560 n and 580 nm.

The classified phosphor materials 7a are mixed in cover members 7.

Figure 7:
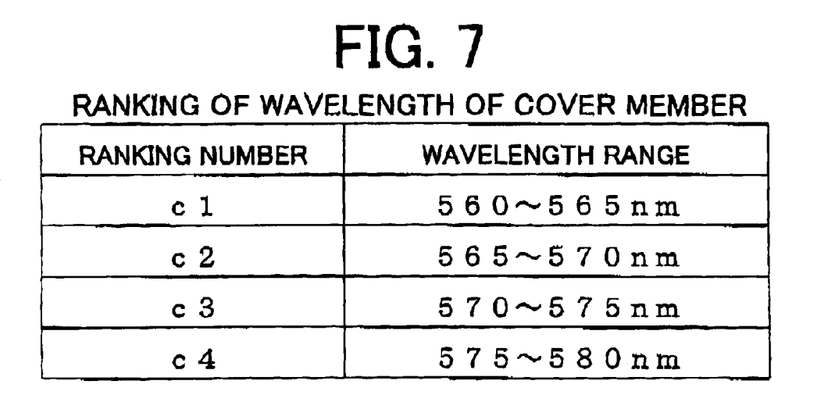
FIG. 7 is a ranking of wavelengths of lights emitted from cover members.

FIG. 7 is a ranking of wavelengths of yellow lights emitted from phosphor particles 7a. The wavelength is classified into four ranking numbers c1~c4. The range of one group is 5 nm.

As described above, the pigment particles 7b are mixed in the cover member 7 in order to correct the luminance to a desired luminance. The luminance is changed by changing the mixing ratio.

Figure 8:
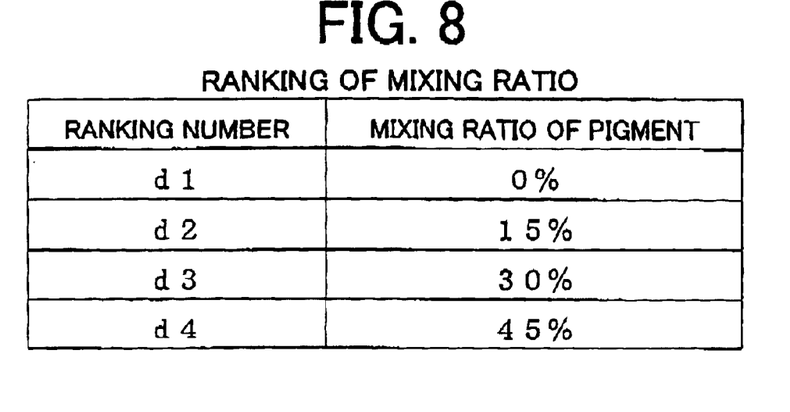
FIG. 8 is a ranking of pigment mixing ratio of cover members.

FIG. 8 is ranking groups of mixing ratio of pigment. The mixing ratio of luminance pigment is classified into four ranking groups d1~d4 in the range between 0.6 and 2.0. The range of the mixing ratio is between 0% and 45%.

Thus, the cover member 7 is classified into 16 ranks (4 groups×4 groups=16 groups). Namely, 16 ranking groups are indicated as c1d1, c1d2, . . . c4d4.

Figure 9:
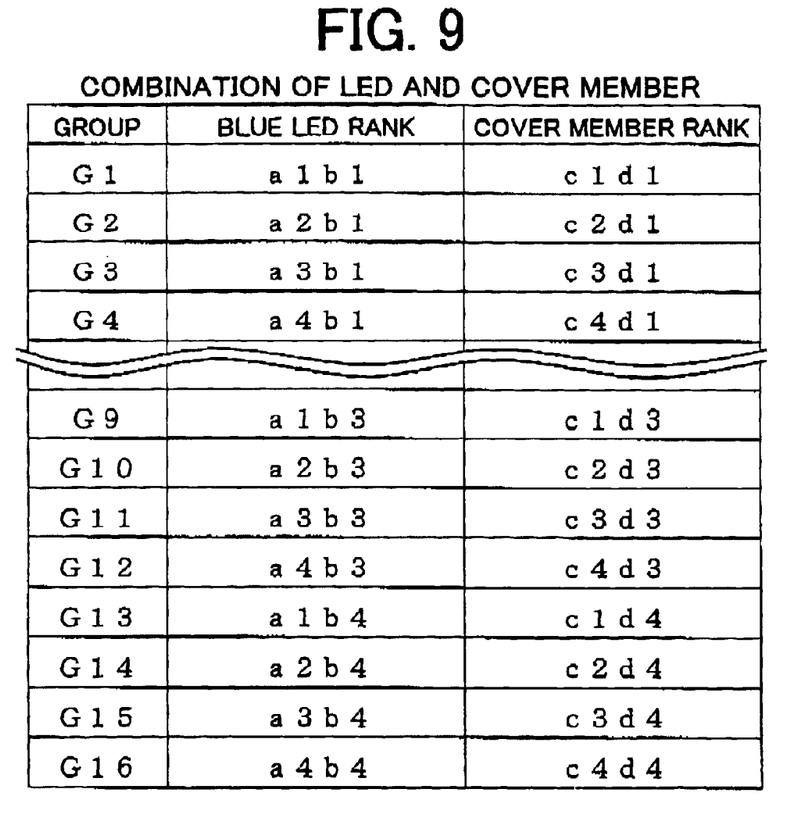
FIG. 9 is a graph showing the combination of ranks.

Next, the wavelength and luminance groups of LED 5 and the groups of the wavelength due to the phosphor particle and pigment groups are combined. FIG. 9 shows the complete combination of groups, For example, the group G1 complements the group a1 which is a shorter side of the central wavelength 470 nm of the light emitted from the LED and the rank c1 which is a shorter side of th central wavelength 570 nm of the light emitted from the phosphor particles.

Similarly, groups G2~G4 are combinations of wavelength ranking groups a2~a4 and wavelength ranking groups c2~c4.

Further, for example, the group G1 is combination of the rank b1 which is the smallest ranking group of luminance of the LED and the rank d1 which is the smallest mixing ratio of the pigment 7b.

Figure 10:
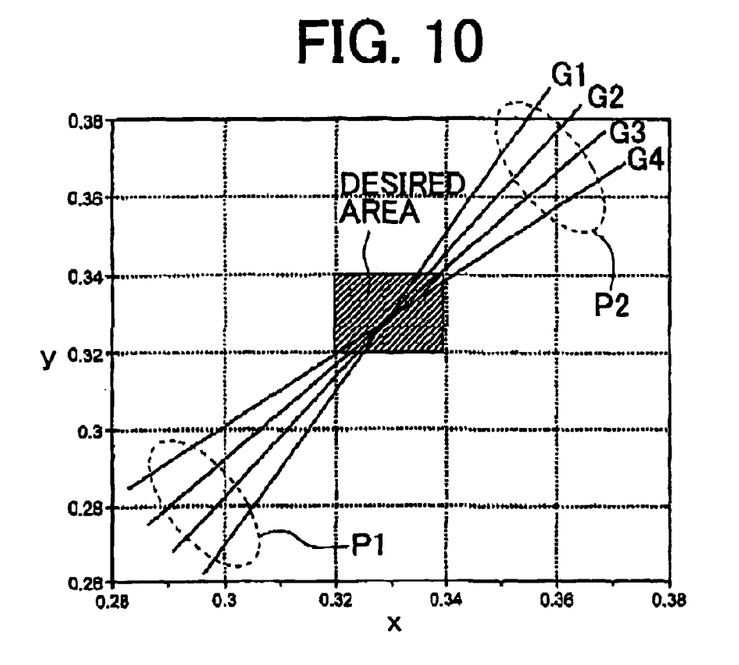
FIG. 10 is a graph showing a part of the chromaticity coordinates of the chromaticity correction.

FIG. 10 is a graph showing a part of the chromaticity coordinates of the chromaticity correction. Lines G1~G4 show change of chromaticity of white light emitted from the LED device based on the groups G1~G4. Here, the left lower range P1 of the lines G1~G4 is chromaticity of light emitted from LED devices in which mixing quantity of phosphor particle is small, so that the white light is bluish. The right upper range P2 of the lines G1~G4 is chromaticity of light emitted from LED device in which mixing quantity of phosphor particle is large, so that the white light is yellowish.

Here, the ranking group G1 of the wavelength for LED 5 is a1 which is the shortest wavelength. Therefore, the value of the X-coordinate in the range P1 is the largest value, and the value of the Y-coordinate is the smallest value. Thus, the chromaticity of the light is almost blue.

Furthermore, the wavelength ranking group of the cover member for G1 is c1 which is the shortest wavelength. Therefore, the value of the X-coordinate in the range P2 is the smallest value, and the value of the Y-coordinate is the largest value. Thus, the chromaticity of the light is almost green.

Further, the rank of the wavelength of the group G4 is a4 which is characterized by the longest wavelength of the LED 5. Therefore, the value of the X-coordinate in the range P1 is the smallest value, and the value of the Y-coordinate is the largest value. Thus, the chromaticity of the light is greenish compared to other groups.

Furthermore, the rank of the wavelength of the group G4 is c4 which is characterized by the largest wavelength of phosphor particles. Therefore, the value of the X-coordinate in the range P2 is the largest value, and the value of the Y-coordinate is the smallest value. Thus, the chromaticity of the light is reddish compared to other groups.

Thus, it will be understood that, by combining the LED 5 and the cover member in which phosphor particles are mixed, the groups G1~G4 change in inclination of chromaticity with the difference of wavelength, and that the chromaticity of groups G1~G4 can be corrected to chromaticity in the desired area shown by hatching by changing the quantity of phosphor particles in the cover member 7. As to other groups G5~G16, the same effect is provided.

Figure 11:
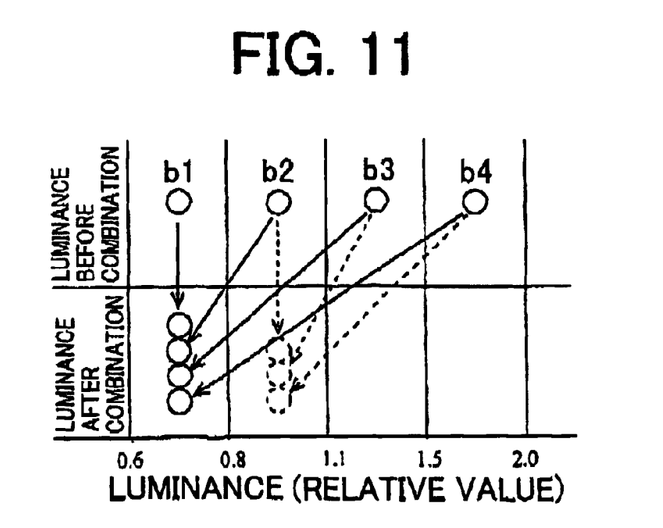
FIG. 11 is a table showing a luminance correcting effect by the combination.

FIG. 11 is a table showing a luminance correcting effect by the combination of the LED 5 and the cover member 7. The horizontal axis shows relative luminance. Since the luminance of the light emitted from the LED 5 is classified into four ranks b1~b4, the luminance before combining the cover member 7 is dispersed into four ranks b1~b4 as shown in the table.

As shown in FIG. 9, when the LED 5 in ranking group b1 is combined with the cover member 7 in ranking group d1, the ranking group b2 is combined with ranking group d2, the ranking group b3 is combined with the ranking group d3, and the ranking b4 is combined with the ranking group d4, luminance of all ranks is corrected to the luminance of rank b1 as shown by arrows in FIG. 11.

More particularly, since the LED 5 in the ranking group b1 of the darkest is combined with the cover member 7 in the ranking group d1 of the lowest mixing ratio 0%, the white light Pw passes through the cover member 7 without interference of pigment. Since the LED 5 in the ranking group b4 having the highest luminance is combined with the cover member 7 in the ranking group d4 having the highest mixing ratio 45%, the white light Pw is interfered by the pigment, so that the luminance reduces to the level of rank b1. As a result, all white lights converge to the rank b1.

When required luminance is not so severe for example, the required range is 0.6 to 1.1, ranks b1 and b2 are combined with rank d1, rank b3 is combined with rank d2, and rank b4 with rank d3. Thus, as shown by broken line arrows in FIG. 11, the ranks converge to the rank b2.

Figure 12:
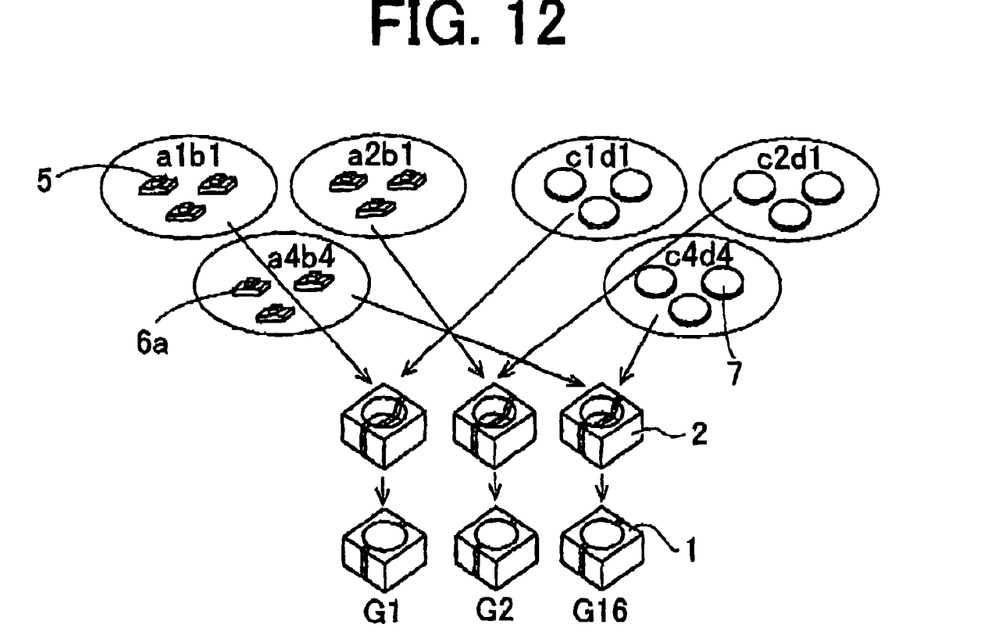
FIG. 12 is a perspective view showing steps for manufacturing LED device of the present invention at every group.

FIG. 12 is a perspective view showing steps for manufacturing LED device of the present invention at every group. LEDs 5 each mounted on the substrate 6a and cover member 7 are divided into sixteen groups G1~G16, and mounted in cases 2 at every group. For example, the LED 5 in ranking group a1b1 is mounted in th case 2, and then the cover member 7 in the ranking group c1d1 is mounted in the cas 2, thereby to produce the LED device 1 in the ranking group G1. When the LED device 1 belonging to the group G2, the LED 5 in the ranking groups a2b1 and the cover member 7 in the ranking group c2d1 are mounted in the case 2, respectively. Other LED devices belonging to other groups are manufactured by the same method.

Hereinafter describes a method for manufacturing a plurality of LED devices at the same time.

Figure 13:
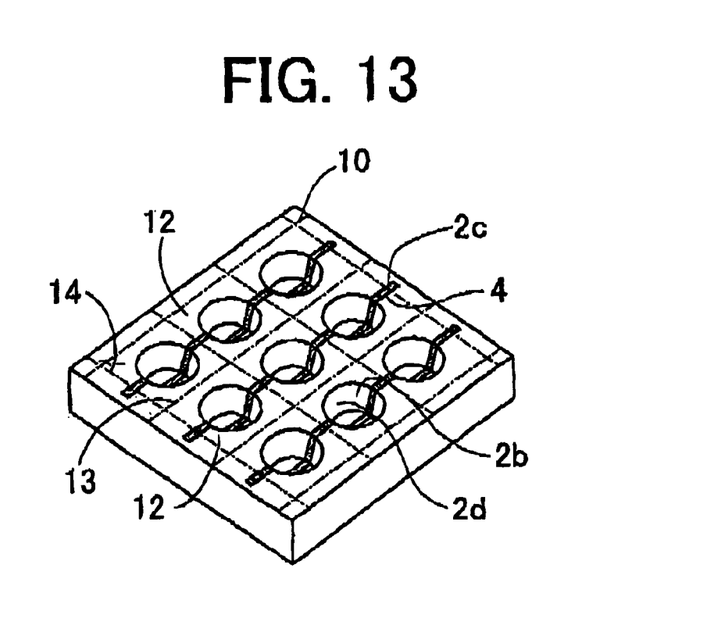
FIG. 13 is a perspective view of a case assembly.

FIG. 13 is a perspective view of a case assembly 10. The case assembly 10 is made of metal such as Mg alloy by injection molding.

The case assembly 10 is divided into nine areas 12 for nine LED devices by dicing lines 13 and 14. The recess 2b is formed in each area 12 at a central portion. Three slits 2c are formed in parallel to the lines 13 except the both end portions so as not to separate the case assembly 10. Each of the slits 2c is charged with the insulation resin 4. The wall of the recess 2b is processed into a glossy surface 2d by Ag plating.

Figure 14:
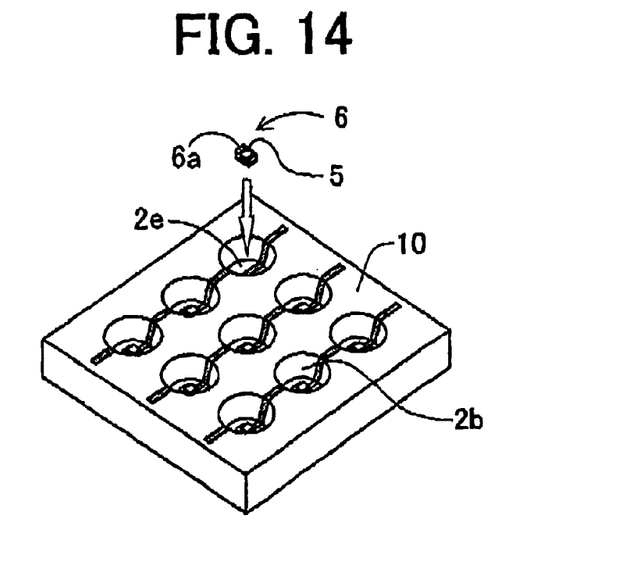
FIG. 14 is a perspective view of the case assembly before mounting an LED.

Next, nine LEDs 5 each mounted on the substrate 6a, belonging to the same group are mounted in the recesses 2b as shown in FIG. 14.

Figure 15:
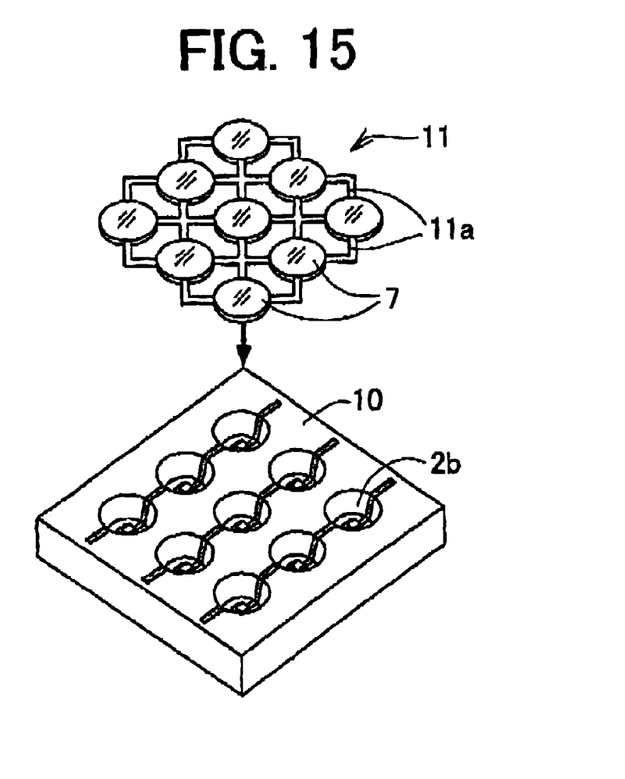
FIG. 15 is a perspective view showing mounting operation of the cover member.

FIG. 15 is a perspective view showing mounting operation of the cover member 7. Nine cover members 7, each belonging to the same group as the group of the LED 5 are connected by connecting member 11a of the same material as the cover member 7, corresponding to the recesses 2b to form an cover member assembly 11. For example, if the group of the LED 5 is group G4 in ranking group a4b1, the group of the cover member 7 of the assembly 11 is also group G4 in the ranking group c4d1.

Cover members 7 of the assembly 11 are mounted in the recesses 2b of the case assembly 10 and secured by caulking or adhesive to the walls of the recesses 2b. Thereafter, the connecting members 11a are cut off by a tool.

Figure 16:
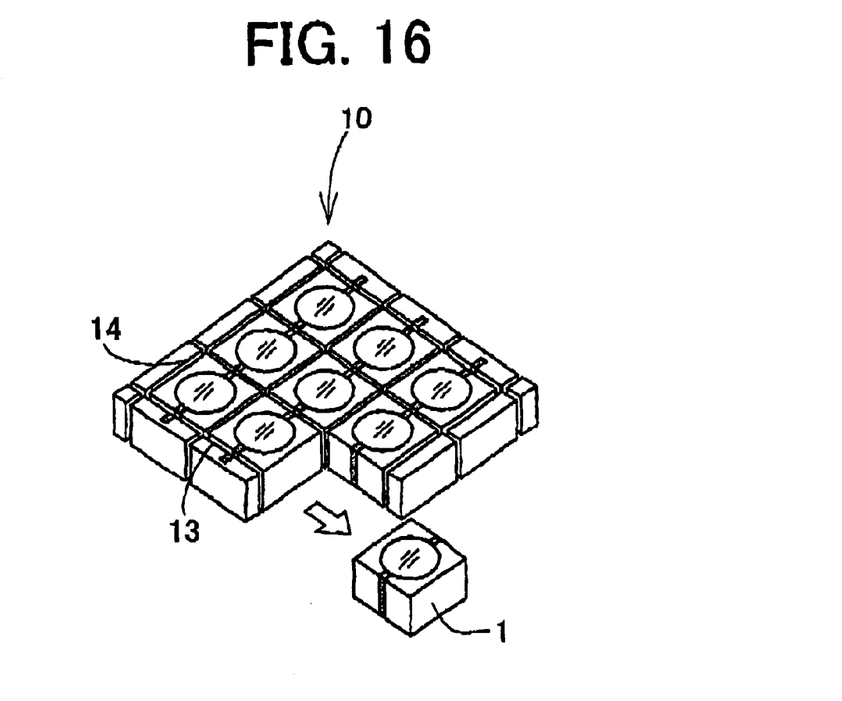
FIG. 16 is a perspective view showing LED devices separating step from an assembly board.

FIG. 16 is a perspective view showing a separating step of the case assembly 10. As shown in FIG. 16, the case assembly 10 is cut off along the dicing lines 13 and 14 to separate the independent LED device 1.

In accordance with the present invention, the light emitting elements and cover mashers belonging to group for obtaining a desired characteristic are combined.

Therefore, the light emitting element device can be manufactured at a high yield.

While the invention has been described in conjunction with preferred specific embodiment thereof, it will be understood that this description is intended to illustrate and not limit the scope of the invention, which is defined by the following claims,

What is claimed is:

1. A method for manufacturing a white light emitting device comprising the steps of:
   classifying wavelengths and luminances of lights emitted from light emitting elements into ranks respectively;
   providing various kinds of combinations of a fluorescent material for converting the wavelength of the light emitted from the light emitting element and a luminance reducing material for adjusting the luminance of the light, in accordance with the rank classification of the wavelength and luminance of the light;
   manufacturing a plurality of cover members, in each of the cover members a fluorescent material and a luminance reducing material of one of combinations are mixed;
   selecting the light emitting element and the cover member;
   integrating the selected light emitting element and cover member.

2. The method according to claim 1 wherein both the fluorescent material and luminance reducing material are included in a same cover member.

3. The method according to claim 1 wherein the cover member comprises a first cover member mixing the fluorescent material, and a second cover member mixing the luminance reducing member.

4. The method according to claim 1 wherein the cover member is formed with elastomer of silicon group in which the fluorescent material and the luminance reducing material are mixed.

5. The method according to claim 1 wherein the luminance reducing material is pigment or dye for reducing the luminance irrespective of the wavelength of the light emitting from the light emitting element.

6. The method according to claim 1 wherein the light emitting element is mounted on a substrate to be integrated with the substrate as a light emitting element unit.

7. A method for manufacturing a white light emitting device comprising the steps of:
   measuring chromaticities and luminances of lights emitted from a plurality of blue light emitting elements;
   classifying the measured chromaticities and luminances of lights emitted from the light emitting elements into ranks respectively;
   manufacturing a plurality of cover members, which are different from each other in accordance with the rank classification of the blue light emitting elements;
   combining the blue light emitting element and the cover member which are suitable to be combined according to the ranking; and
   setting the combined blue light emitting element and cover element in a case body in an integrated state.

8. A method for manufacturing a white light emitting device comprising the steps of:
   measuring chromaticities and luminances of lights emitted from a plurality of blue light emitting elements;
   classifying the measured chromaticities and luminances of lights emitted from the light emitting elements into ranks respectively;
   manufacturing a case assembly having a plurality of case bodies;
   mounting a plurality of blue light emitting elements belonging to a same rank in case bodies;
   manufacturing a plurality of cover members including various fluorescent materials and luminance reducing materials;
   securing cover members having a same condition as the blue light emitting elements mounted on the case assembly to the case bodies to produce complete light emitting devices; and
   separating the complete light emitting devices from the case assembly.

9. The method according to claim 8 wherein cover members corresponding to the case bodies on the case assembly are connected with each other to form a cover member assembly, each of the cover members is located at a position corresponding to a case body on the case assembly.

10. The method according to claim 8 wherein the fluorescent materials and the luminance reducing materials in the cover members in the cover member assembly are nearly identical in mixing condition.

11. The method according to claim 7 or 8 wherein the case body has a recess having a reflection face, and the light emitting element is mounted on a bottom of the recess, and the cover member is mounted in the recess.

12. The method according to claim 1 or 8 wherein the light emitting element is an LED of InGaN group.

13. The method according to claim 12 wherein the fluorescent material is a fluorescent material of YAG group.

14. The method according to claim 12 wherein the luminance reducing material is a pigment of black.

15. The method according to claim 7 or 8 wherein the case body comprises a pair of metal cores, the surface of the metal cores are coated with bright plating.

* * * * *